United States Patent [19]

Kobayashi

[11] Patent Number: 4,658,402
[45] Date of Patent: Apr. 14, 1987

[54] OPTICAL BISTABLE SEMICONDUCTOR LASER PRODUCING LASING LIGHT IN DIRECTION NORMAL TO SEMICONDUCTOR LAYERS

[75] Inventor: Kohroh Kobayashi, Tokyo, Japan
[73] Assignee: NEC Corporation, Tokyo, Japan
[21] Appl. No.: 658,007
[22] Filed: Oct. 5, 1984
[30] Foreign Application Priority Data Oct. 6, 1983 [JP] Japan .................................. 58-187312

[51] Int. Cl.⁴ .............................................. H01S 3/19
[52] U.S. Cl. ......................................... 372/50; 372/8; 372/96; 372/108
[58] Field of Search ......................... 372/96, 50, 8, 108
[56] References Cited
U.S. PATENT DOCUMENTS
3,996,492 12/1976 McGroddy ........................... 372/44

FOREIGN PATENT DOCUMENTS
2105101 3/1983 United Kingdom .................. 372/50

*Primary Examiner*—James W. Davie
*Attorney, Agent, or Firm*—Sughrue, Mion, Zinn, Macpeak, and Seas

[57] ABSTRACT

A semiconductor laser for use as a bistable optical device in which an active semiconductor layer has corrugations of predetermined pitch on its surface and a semiconductor optical waveguide is formed on the corrugation. At least one end of the active layer is exposed at an oblique angle so that light in the active layer propagating along the direction of corrugation is reflected from the oblique face to a normal of the surface of the laser. Electrodes are provided above and below the active layer.

3 Claims, 15 Drawing Figures

OPTICAL BISTABLE SEMICONDUCTOR LASER PRODUCING LASING LIGHT IN DIRECTION NORMAL TO SEMICONDUCTOR LAYERS

BACKGROUND OF THE INVENTION

The present invention relates to a semiconductor laser, and more particularly to a semiconductor laser having optical bistability.

Bistable optical elements have a plurality of stability points for each input level and are considered as basic elements to constitute circuits having such optical functions as optical logic, optical memory and optical delaying. Such optical functional circuits are usually composed by arranging many bistable optical elements in parallel. However, since known bistable optical elements, above all bistable lasers, are realized by forming multiple semiconductor layers formed over a semiconductor substrate and providing the elements with divided electrodes, its output light is usually parallel to the semiconductor substrate. (See for example, H. Kawaguchi, "Bistable Operation of Semiconductor Lasers by Optical Injection", ELECTRONICS LETTERS, Vol. 17, No. 20, October 1981, pp. 741–742, and Ch. Harder el al., "Bistability and Pulsations in CW Semiconductor Lasers with a Controlled Amount of Saturable Absorption", APPLIED PHYSICS LETTERS, Vol. 39, No. 5, September 1981, pp. 382–384.) As a result, where many elements are to be formed over the same substrate, they can only be arranged in a one-dimension or integrated only in a linear array, so that the number of elements that can be integrated is inevitably limited. As a solution to this problem, there is known the so-called surface emission laser, which generates laser oscillation in a direction normal to the substrate and the semiconductor layers laminated over it. This type laser enables the elements to be arranged in two dimensions over the substrate surface, or integrated in a matrix form, but the surface emission laser itself has so high an oscillation threshold as to make its operation not only extremely difficult at room temperature but also virtually impossible when integrated. Therefore, it is by no means a useful element for any practical purpose.

SUMMARY OF THE INVENTION

An object of the present invention is to provide a bistable laser making possible integration in a matrix form.

According to the invention, there is provided a distributed feedback type bistable laser having a multilayered structure involving an optical waveguide layer with a diffraction grating and an active layer, at least one end of the structure being so formed as to have an oblique face, and the electrode opposite to the oblique face is partly removed to let the output light be taken out therefrom.

For the purpose of realizing a bistable laser making possible integration in a matrix form, its output light is taken out in a direction substantially normal to the substrate according to the present invention. Used in a distributed feedback type laser, the resulting structure does not require paired parallel end faces as a resonator, but instead has one of its end face formed obliquely, and an part for the laser beam reflected thereon is opened through electrode.

DETAILED DESCRIPTON OF PREFERRED EMBODIMENTS

Figure 1:
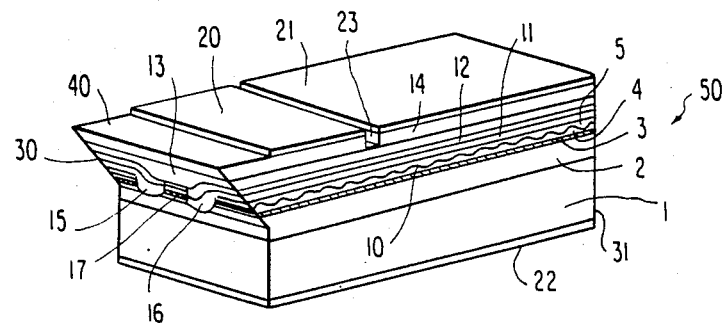
FIG. 1 shows an oblique view of one preferred embodiment of the present invention.
Figure 2:
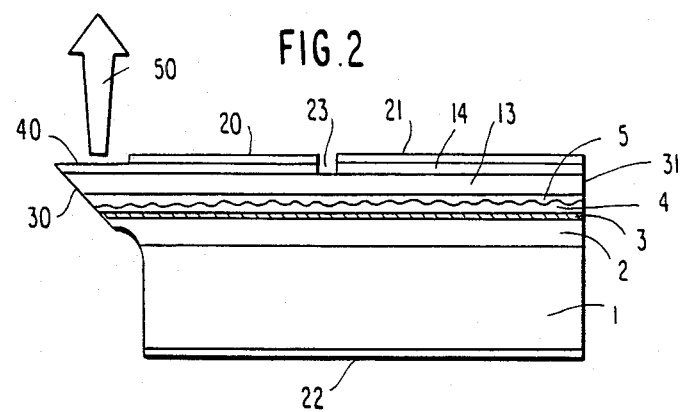
FIG. 2 shows a longitudinal section of the embodiment illustrated in FIG. 1.

FIGS. 1 and 2 respectively show an oblique view and a longitudinal section of a bistable laser according to the present invention.

The bistable laser has a stratified structure consisting of an n-InP substrate 1, an n-InP buffer layer 2, an InGaAsP active layer 3, an InGaAsP optical waveguide layer 4 having a surface corrugated in a fixed pitch, and a p-InP clad layer 5. In this stratified structure are formed two grooves 15 and 16, both in a direction normal to the troughs of the corrugation, with a mesa structure 17 in-between. Over the upper face of the stratified structure, except the mesa top surface, are a p-Inp current blocking layer 11 and an n-InP current confining layer 12. Over the upper faces of the mesa and the current confining layer 12 are a p-InP burying layer 13 and a p-InGaAsP cap layer 14. The cap layer 14 is divided by a groove 23, and over the divided faces are formed a p electrode 21 and another p electrode 20 except where light outlets 40 are formed, one on each divided part. At the bottom of the substrate 4 is formed an n electrode 22. At one of the ends, viewed in a direction normal to the troughs of the corrugation (the axis of oscillation), is formed a cleaved face, and at the other end, a plane 30 inclined at 45 degrees vis-a-vis the cleaved face.

A first production process of this laser will be explained below with reference to FIGS. 3A to 3H. Although a real laser diode (LD) element would be formed in a large number and separated on a wafer, the following description of the process will apply the same denominations and reference numerals as those for different parts of the LD element to the respectively corresponding parts on the wafer. After forming the n-InP buffer layer 2 (3 microns thick, Sn-doped, $5 \times 10^{17}$ $cm^{-3}$), the InGaAsP active layer 3 (0.1 micron thick, non-doped, 1.3 microns in composition wavelength) and the InGaAsP optical waveguide layer 4 (0.15 micron thick, non-doped, 1.15 microns in composition wavelength) are sequentially formed over the n-InP substrate 1. A diffraction grating 10 having a pitch of 0.394 micron is formed over the optical waveguide layer 4 by an interfering light-exposure method using He-Cd laser light and by chemical etching, and over it is further formed the p-InP cladding layer 5 (1 micron thick, Zn-doped, $1 \times 10^{18}$ $cm^{-3}$). After that, the two grooves 15 and 16, about 7 microns wide and 3 microns deep, are formed by chemical etching in a direction parallel to the pitch of the diffraction grating 10, with a 1.5 micron wide mesa left between them over the grooves 15 and 16 are formed. The p-InP current blocking layer 11 (1 micron thick, Zn-doped, $1\times10^{18}$ cm$^{-3}$) and the n-InP current confining layer 12 (0.7 micron thick, Te-doped, $5\times10^{17}$ cm$^{-3}$), except over the mesa 17 between the two grooves 15 and 16. Layers 11 and 12 are not illustrated in FIGS. 3A–3H. Then a p-InP burying layer 13 (1.5 microns, Zn-doped, $7\times10^{17}$ cm$^{-3}$) and the p-InGaAsP cap layer 14 (1 micron thick, Zn-doped, $1\times10^{19}$ cm$^{-3}$) are formed to cover the whole, and the crystal growth is thereby completed. The foregoing production process and structure are disclosed in U.S. patent application Ser. No. 434,990 filed Oct. 18, 1982 by Kitamura el at., now U.S. Pat. No. 4,525,841.

Figure 3A:
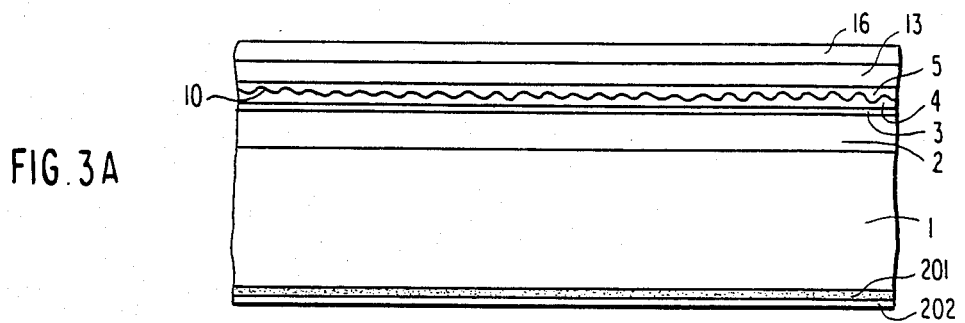
FIGS. 3A to 3H illustrate the production process of the embodiment of FIGS. 1 and 2, FIG. 3C showing a bottom view and others, longitudinal sections.
Figure 3B:
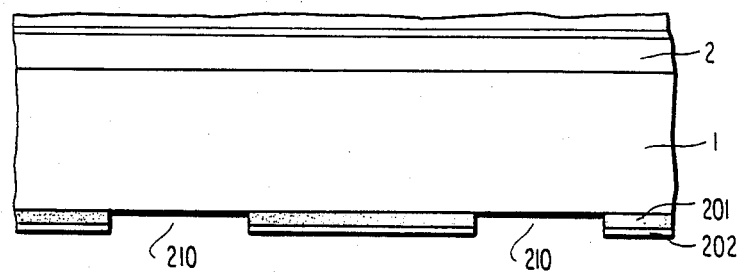
Figure 3C:
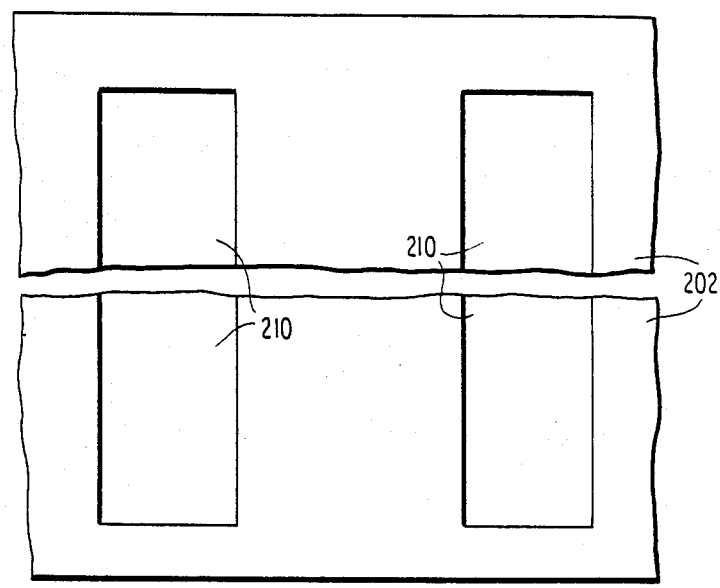
Figure 3D:
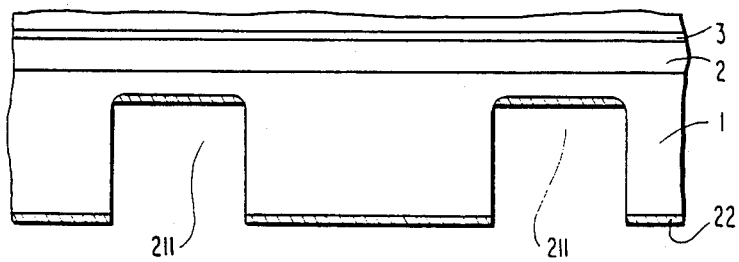

After the n-InP substrate 1 of the previously described stratified structure is polished by a mechano-chemical method to a thickness of about 100 microns, an SiO$_2$ film 201 (3000 Å thick) and a photoresist film 202 (1500 Å thick) are attached thereto by CVD and spin coating, respectively (FIG. 3A). In this state, the photoresist film 202 and the SiO$_2$ film 201, in this order, are etched by the ordinary photolitho process and, as illustrated by the partial section of FIG. 3B and the plan of FIG. 3C, holes 210 of about 60 microns in width, reaching neither the bottom side of the substrate 1, are formed in a direction normal to the two grooves 15 and 16. The distance between the holes 210 is about 600 microns. After removing the photoresist film 202, with this SiO$_2$ film 201 being used as the mask, only those parts of the substrate 1 that correspond to the holes 210 are etched with liquid HCL to a depth of about 80 microns to form grooves 211, and an n electrode 22 is formed by evaporating an AuGeNi metal film to the surface cleared of the SiO$_2$ film and heating it for one minute at 350° C. to alloy it (FIG. 3D).

Figure 3E:
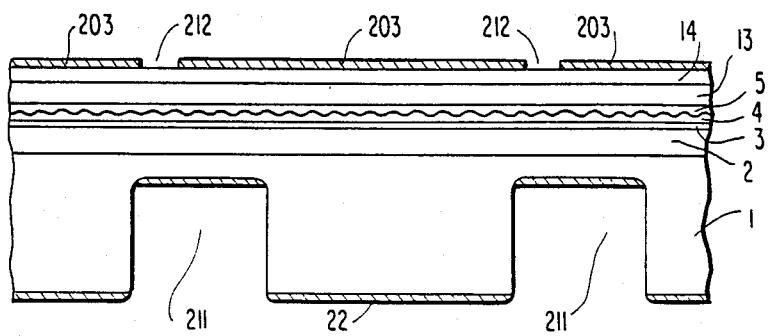
Figure 3F:
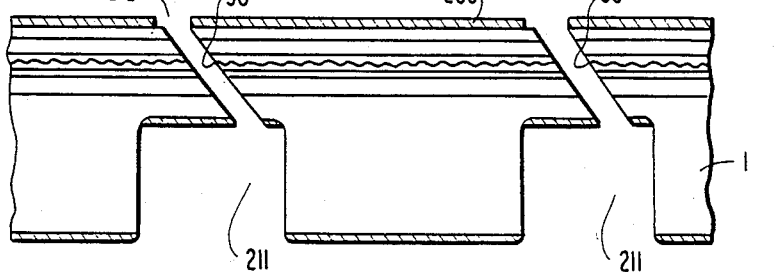
Figure 3G:
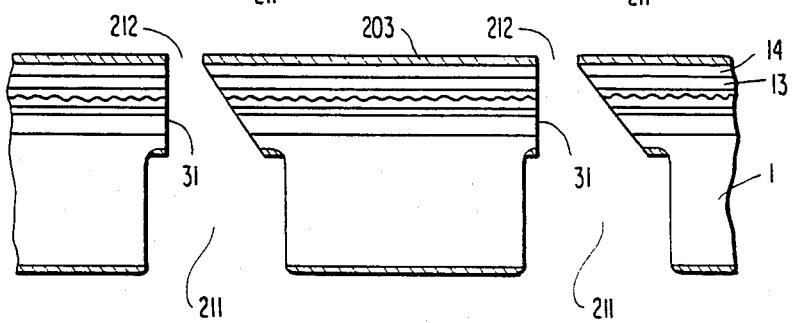
Figure 3H:
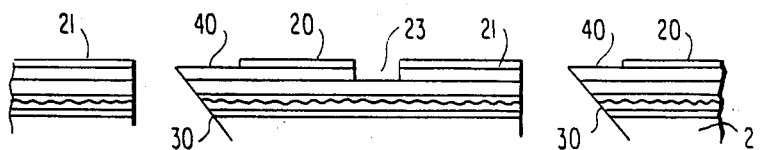

Next, a metal film 203 of Au-Zn-Cr-Au is evaporated over the cap layer 14, and those parts of the metal above the grooves 211 are removed by the usual photolitho process and ion milling process in 15 micron wide bands to open ports 212 (FIG. 3E). Only those parts of the underlying layers beneath the ports 212 are obliquely removed by an ion etching process of irradiating ion beams in a 45-degree inclined direction, with the metal film 203 being used as the mask, to form the faces 30 inclined against the substrate 1 (FIG. 3F). Then vertical faces 31 are formed by irradiating ion beams from above in a direction normal to the substrate 1 (FIG. 3G). After that, a photoresist film is applied over the metal film 203, of which a 25 micron width about in the middle between the two ports 212 is removed by the usual photolitho process and ion etching process to form the separating groove 23. Then the corresponding part of the cap layer 14 is selectively removed with an etching liquid of $3H_2SO_4+H_2O_2+H_2O$ to doubly ensure the separation between the electrodes. Further after that, another photoresist film is applied over the top face, and those parts of the metal film 203 opposite to the oblique faces 30 are removed by the photolitho process and ion etching process to form the light outlets 40. By subjecting these areas to heat treatment at 370° C. for five minutes, p electrodes 20 and 21 are formed (FIG. 3H). By cutting and separating this structure along a plane parallel to the face of the drawing, the production of the element chip is completed.

Figure 4:
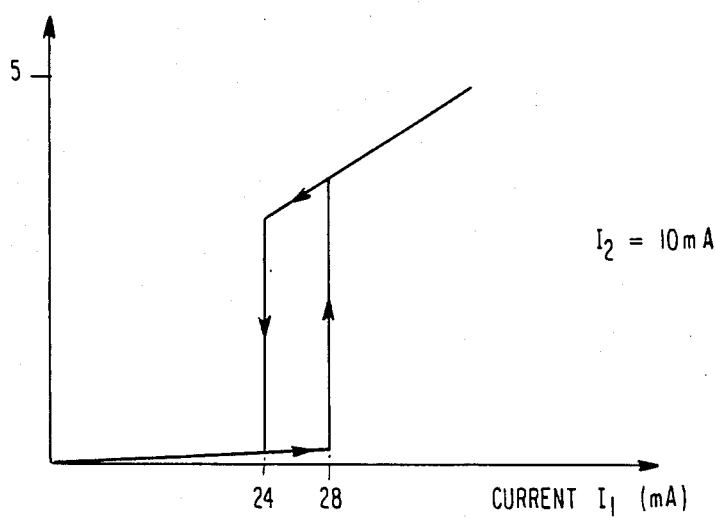
FIG. 4 is a diagram showing the bistable characteristic of the laser according to the invention.

FIG. 4 shows the current-light output characteristic of the element to illustrate an aspect of its performance. The diagram shows the relationship, when a current I2 of 10 mA is applied to the p electrode 21, between a current I1, which is to be applied to the other p electrode 20, and the light output. Then, a threshold of 28 mA when the power is on and another threshold of 24 mA when the power is off, both at room temperature, are obtained for the current I1. Thus is realized a laser action accompanied by a so-called hysteresis, and thereby is achieved a bistable laser. When the current I2 is lowered, the thresholds in both on and off states will rise, and the difference between them will also be widened. The reverse will prove true when the current I2 is raised. Whereas this difference between the "on" and "off" thresholds, i.e. the hysteresis current width, is an important parameter where a bistable laser is to be used for an optical memory or the like, the present invention enables the difference to be controlled with the current I2, which to be applied to one of the electrodes. It also allows the current I2 to be so adjusted as to compensate for changes of the thresholds owing to ambient temperature variations or the like. Then, one of laser output beams 50 is totally reflected by the oblique face 30, and goes out of the outlet 40 in a direction substantially normal to the substrate. Thus, since the invention can provide a light output normal to the substrate by the use of a practical semiconductor laser, many units of the bistable laser, which is the first preferred embodiment thereof, can be integrated two-dimensionally over the same substrate, and thereby can be realized an arrangement of bistable lasers in a matrix for multi-channel use.

Although split p electrodes are used in this embodiment, bistable operation can be achieved even without using split electrodes because the outlet 40, where no current is injected, serve as a saturable absorber.

Figure 5:
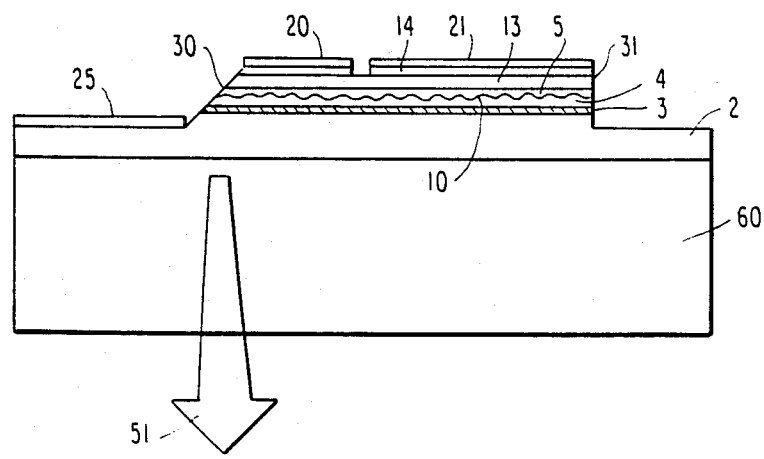
FIG. 5 shows a section of a second preferred embodiment of the invention.

FIG. 5 shows a section of a second preferred embodiment of the present invention. The differences of this second embodiment from the first are that an semi-insulated substrate 60 is used as the InP substrate and that the oblique face 30 is formed in such a direction that the reflection of laser beams from within the laser goes is toward the substrate 60. In this embodiment, an n electrode 25 is formed over the n-InP buffer layer 2. Thus there is no electrode metal in the part opposite to the oblique face 30, and laser output beams 51 can be taken out in a direction substantially normal to the substrate without being obstructed. Therefore, this embodiment also makes it possible to integrate many bistable lasers two-dimensionally over the same substrate.

Figure 6:
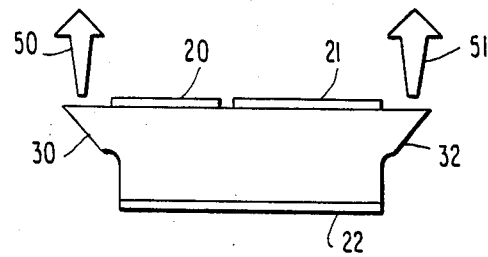
FIGS. 6 to 8 are typical illustrations of other preferred embodiments of the invention, each representing a different embodiment.
Figure 7:
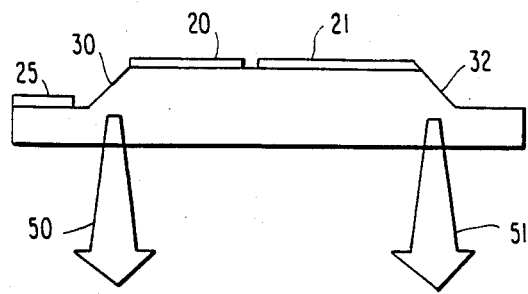
Figure 8:
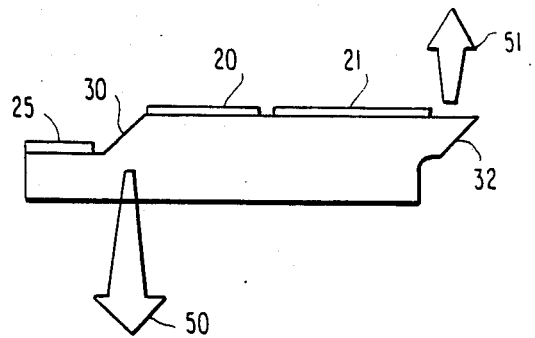

FIGS. 6 to 8 are typical diagrams for describing how light beams are taken out of third to fifth preferred embodiments of the present invention. In these embodiments, oblique faces 30 and 32 crossing the active layer 3 and the optical waveguide layer 4 are formed at the two ends, one at each end, and the direction in which the laser output beams 50 and 51 are taken out can be varied between the opposite side to and the same side as the substrate 1 by varying the inclinations of the oblique faces (these embodiments are similarly structured to the first in other respects). Whereas trigger is often applied with the light input in bistable lasers in general, the structures illustrated here, because of the reversibility of light, make it possible for the input light to be injected in a direction reverse to at least one of the laser output lights 50 and 51.

In any of the foregoing embodiments, the cap layer 6 had better be removed in the light outlets 40 because the light absorption can be decreased and the efficiency improved thereby.

What is claimed is:

1. A bistable semiconductor laser for use in a bistable optical device comprising:

UNITED STATES PATENT AND TRADEMARK OFFICE
CERTIFICATE OF CORRECTION

PATENT NO.　　:　4,658,402

DATED　　　　:　April 14, 1987

INVENTOR(S)　:　KOHROH KOBAYASHI

It is certified that error appears in the above-identified patent and that said Letters Patent is hereby corrected as shown below:

Column 1, line 31, delete "a".

Column 1, line 32, insert -- , -- after "dimension".

Column 1, line 67, delete "part" insert --outlet port--.

Column 3, line 6, delete "illustrate" insert --illustrated--.

Column 3, line 24, delete "neither".

Column 5, line 8, delete " : " insert -- ; --.

Column 6, line 19, delete "is" insert --are--.

Signed and Sealed this

Twenty-second Day of March, 1988

*Attest:*

DONALD J. QUIGG

*Attesting Officer*　　　　*Commissioner of Patents and Trademarks*